US009203007B2

(12) United States Patent
Lee et al.

(10) Patent No.: US 9,203,007 B2
(45) Date of Patent: Dec. 1, 2015

(54) LIGHT EMITTING DIODE ASSEMBLY

(75) Inventors: Chung Hoon Lee, Ansan-si (KR); Dae Sung Kal, Ansan-si (KR); Won Cheol Seo, Ansan-si (KR); Young Eun Yang, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 72 days.

(21) Appl. No.: 14/123,393

(22) PCT Filed: May 25, 2012

(86) PCT No.: PCT/KR2012/004180
§ 371 (c)(1),
(2), (4) Date: Feb. 13, 2014

(87) PCT Pub. No.: WO2012/165819
PCT Pub. Date: Dec. 6, 2012

(65) Prior Publication Data
US 2015/0034979 A1    Feb. 5, 2015

(30) Foreign Application Priority Data
Jun. 1, 2011    (KR) .................. 10-2011-0052970

(51) Int. Cl.
*H01L 33/64* (2010.01)
*H01L 27/15* (2006.01)
*H01L 25/075* (2006.01)
*F21K 99/00* (2010.01)

(52) U.S. Cl.
CPC . *H01L 33/64* (2013.01); *F21K 9/13* (2013.01); *H01L 25/0753* (2013.01); *H01L 27/15* (2013.01); *H01L 33/642* (2013.01); *H01L 33/647* (2013.01); *H01L 2224/48091* (2013.01); *H01L 2224/48247* (2013.01)

(58) Field of Classification Search
CPC ................................ H01L 33/64; H01L 27/15
USPC ............................................................ 257/89
See application file for complete search history.

(56) References Cited

U.S. PATENT DOCUMENTS

| 2007/0221928 | A1  | 9/2007 | Lee et al. |
| 2009/0161354 | A1  | 6/2009 | Hsu et al. |
| 2010/0090231 | A1  | 4/2010 | Jung et al. |
| 2010/0193807 | A1* | 8/2010 | Park ............................ 257/88 |
| 2011/0211334 | A1* | 9/2011 | Kim ............................ 362/84 |

FOREIGN PATENT DOCUMENTS

| JP | 2009-194213 | 8/2009 |
| KR | 10-0703218  | 4/2007 |
| KR | 10-0982994  | 9/2010 |

OTHER PUBLICATIONS

International Search Report issued on Nov. 28, 2012 in the International Application No. PCT/KR2012/004180.

* cited by examiner

*Primary Examiner* — Marc Armand
(74) *Attorney, Agent, or Firm* — H.C. Park & Associates, PLC (57) ABSTRACT

Disclosed is a light emitting diode assembly. The light emitting diode assembly comprised: a red light emitting diode chip; a short-wavelength light emitting diode chip emitting a light having a wavelength relatively shorter than that of a light emitted from the red light emitting diode chip; a first heat-dispersion member for dispersing most of the heat generated in the short wavelength light emitting diode chip; and a second heat-dispersion member for dispersing most of the heat generated in the red light emitting diode chip. Further, the second heat-dispersion member has heat dispersion performance relatively superior to that of the first heat dispersion member. Thus, spectrum movement in the red light emitted from the red light emitting diode chip may be prevented so as to prevent a color-coordinate transformation during the operation time of same.

16 Claims, 9 Drawing Sheets

LIGHT EMITTING DIODE ASSEMBLY

CROSS-REFERENCE TO RELATED APPLICATIONS

This application is the National Stage Entry of International Application PCT/KR2012/004180, filed on May 25, 2012 and claims priority from and the benefit of Korean Patent Application No. 10-2011-0052970, filed on Jun. 1, 2011, all of which are incorporated herein by reference in their entireties for all purposes as if fully set forth herein.

BACKGROUND

1. Filed

The present invention relates to a light emitting diode assembly, and more particularly, to a light emitting diode assembly including a red light emitting diode chip.

2. Discussion of the Background

Light emitting diodes are used as light sources in various products. Particularly, light emitting diodes are used as light sources for backlight units, displays, lighting fixtures, and the like, and can emit white light through combination of light emitting diodes emitting various colors, or combination with phosphors. Particularly, white light can be realized through combination of a blue light emitting diode and a yellow phosphor. However, since the combination of the blue light emitting diode and the yellow phosphor provides white light showing a lack of red emission, a light emitting diode assembly based on this combination has relatively poor color rendering index and relatively high color temperature. Accordingly, a light emitting diode assembly designed to emit white light through combination of light emitting diodes and phosphors also employs a red light emitting diode in order to improve the color rendering index and the color temperature.

As compared with AlInGaN-based blue or UV light emitting diodes, AlInGaP-based red light emitting diodes emit relatively large amounts of heat. Moreover, the red light emitting diodes exhibit significant spectrum shifts according to change of temperature.

As a result, in a light emitting diode assembly including a red light emitting diode, spectrum shift of red light occurs as the junction temperature of the red light emitting diode increases. Thus, even in the case where the light emitting diode assembly realizes white light in desired color coordinates in initial operation, the color coordinates change over time, making it difficult to realize desired white light.

SUMMARY

Exemplary embodiments of the present invention provide a light emitting diode assembly capable of preventing spectrum shift of a red light emitting diode chip.

Exemplary embodiments of the present invention also provide a light emitting diode assembly capable of reducing thermal interference between a red light emitting diode chip and other light emitting diode chips emitting light of different wavelengths.

An exemplary embodiment of the invention provides a light emitting diode assembly including: a red light emitting diode chip; a short wavelength light emitting diode chip emitting light having a shorter wavelength than light emitted from the red light emitting diode chip; a first heat dissipator dissipating heat generated from the short wavelength light emitting diode chip; and a second heat dissipator dissipating heat generated from the red light emitting diode chip. In addition, the second heat dissipator has higher heat dissipation capability than the first heat dissipator.

Since heat generated from the red light emitting diode chip can be more rapidly dissipated through the second heat dissipator, it is possible to prevent increase in junction temperature of the red light emitting diode chip, whereby spectrum shift of red light can be prevented.

In some embodiments, the light emitting diode assembly may further include a base substrate. In this case, the first heat dissipator may include a first landing pad placed on the base substrate, and the second heat dissipator may include a second landing pad placed on the base substrate. In addition, the short wavelength light emitting diode chip is thermally coupled to the first landing pad, and the red light emitting diode chip is thermally coupled to the second landing pad.

Further, the first heat dissipator may include a first external pad placed under the base substrate and a first via connecting the first landing pad to the first external pad, and the second heat dissipator may include a second external pad placed under the base substrate and a second via connecting the second landing pad to the second external pad.

In order to allow the second heat dissipator to have higher heat dissipation capability than the first heat dissipator, the second landing pad may have a larger surface area than the first landing pad, the second external pad may have a larger area than the first external pad, the second external pad may have a larger surface area than the first external pad, and/or the second via may have a larger volume than the first via. For example, the number of second vias may be greater than the number of first vias.

In some embodiments, the light emitting diode assembly may further include a main body. In addition, the first heat dissipator may include a first internal lead placed within the main body and a first external lead extending from the first internal lead and exposed outside the main body, and the second heat dissipator may include a second internal lead placed within the main body and a second external lead extending from the second internal lead and exposed outside the main body. Such a light emitting diode assembly may be formed using a lead frame.

Further, the short wavelength light emitting diode chip may be thermally coupled to the first internal lead; the red light emitting diode chip may be thermally coupled to the second internal lead; and the second heat dissipator may occupy a larger area than the first heat dissipator. For example, the second internal lead may be wider than the first internal lead and/or the second external lead may be wider than the first external lead.

In some embodiments, the first heat dissipator may include a first heat dissipation slug, and the second heat dissipator may include a second heat dissipation slug. The second heat dissipation slug may have a larger volume than the first heat dissipation slug, and thus can relatively rapidly dissipate heat generated from the red light emitting diode chip.

The light emitting diode assembly may further include a main body; a first internal lead placed within the main body; a first external lead extending from the first internal lead and exposed outside the main body; a second internal lead placed within the main body; and a second external lead extending from the second internal lead and exposed outside the main body. Here, the short wavelength light emitting diode chip is thermally coupled to the first heat dissipation slug, and the red light emitting diode chip is thermally coupled to the second heat dissipation slug.

The first heat dissipation slug is placed adjacent the second heat dissipation slug. In a certain embodiment, the second heat dissipation slug may surround the first heat dissipation slug. Since the second heat dissipation slug is disposed outside the first heat dissipation slug, the second heat dissipation slug can more rapidly dissipate heat generated from the red light emitting diode chip.

The first heat dissipator may be separated from the second heat dissipator. With this structure, it is possible to reduce thermal interference between the short wavelength light emitting diode chip and the red light emitting diode chip.

The light emitting diode assembly may further include a wavelength converter which converts wavelengths of light emitted from the short wavelength light emitting diode chip. For example, the wavelength converter may be encapsulated within a molding portion, or may be disposed as a conformal layer on a light emitting diode chip. The light emitting diode assembly may emit white light containing a red component of the red light emitting diode chip.

In addition, the short wavelength light emitting diode chip may be a light emitting diode chip emitting blue or ultraviolet light. The short wavelength light emitting diode chip may be an AlGaInN-based light emitting diode chip, and the red light emitting diode chip may be an AlGaInP-based light emitting diode chip.

In accordance with another aspect of the present invention, a light emitting diode assembly includes a red light emitting diode chip; a short wavelength light emitting diode chip emitting light having a shorter wavelength than light emitted from the red light emitting diode chip; a first heat transfer passage thermally coupled to the short wavelength light emitting diode chip; and a second heat transfer passage thermally coupled to the red light emitting diode chip. Here, the second heat transfer passage has higher heat transfer capability than the first heat transfer passage.

With this structure, the light emitting diode assembly can relatively rapidly transfer heat from the red light emitting diode chip, thereby preventing spectrum shift of red light emitted from the red light emitting diode chip.

For example, the second heat transfer passage may have a larger total volume than the first heat transfer passage. Alternatively, the number of second heat transfer passages may be greater than the number of first heat transfer passages.

According to the embodiments of the invention, the light emitting diode assembly can prevent spectrum shift of light emitted from a red light emitting diode chip over time and thus can prevent change in color coordinates over time. Furthermore, the light emitting diode assembly suppresses thermal interference between the red light emitting diode chip and the short wavelength light emitting diode chip, whereby the red light emitting diode chip can be less influenced by heat generated from the short wavelength light emitting diode chip, or the short wavelength light emitting diode chip can be less influence by heat generated from the red light emitting diode chip, thereby improving operational stability

DETAILED DESCRIPTION OF THE ILLUSTRATED EMBODIMENTS

Embodiments of the present invention will be described in more detail with reference to the accompanying drawings. It should be understood that the following embodiments are given by way of illustration only to provide thorough understanding of the invention to those skilled in the art. Therefore, the present invention is not limited to the following embodiments and may be embodied in different ways. Further, like components will be denoted by like reference numerals throughout the specification, and the widths, lengths, and thicknesses of certain elements, layers or features may be exaggerated for clarity.

Figure 1:
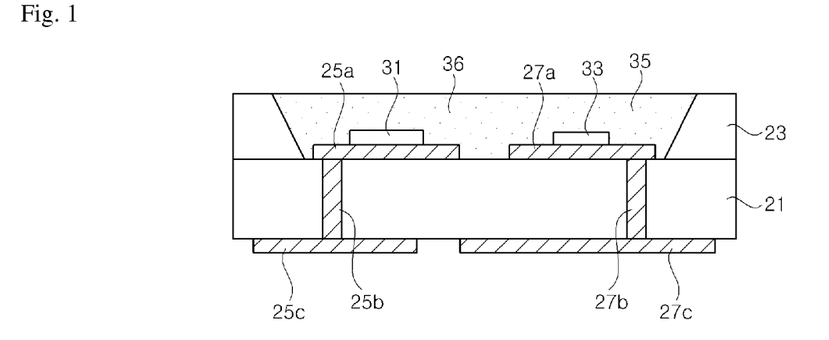
FIG. 1 is a schematic sectional view of a light emitting diode assembly according to one embodiment of the present invention.

FIG. 1 is a schematic sectional view of a light emitting diode assembly according to one embodiment of the present invention.

Referring to FIG. 1, the light emitting diode assembly according to this embodiment includes a base substrate 21, a housing 23, a first landing pad 25a, a second landing pad 27a, a first via 25b, a second via 27b, a first external pad 25c, a second external pad 27c, a short wavelength light emitting diode chip 31, a red light emitting diode chip 33, a molding portion 35, and phosphors 36.

The base substrate 21 may be a ceramic substrate or a printed circuit board. The base substrate 21 supports the landing pads 25a, 27a, and provides through-holes forming the vias 25b, 27b. The housing 23 provides a cavity. When the base substrate 21 is a ceramic substrate, the housing 23 may be formed together with the base substrate 21 using a ceramic material. The housing 23 may act as a reflector that reflects light. The housing 23 may be omitted.

The first landing pad 25a is a pad on which the short wavelength light emitting diode chip 31 is mounted, and the second landing pad 27a is a pad on which the red light emitting diode chip 33 is mounted. Both the first and second landing pads 25a, 27a are placed on the base substrate 21. The first and second landing pads 25a, 27a are formed of a conductive material and thus have higher thermal conductivity than the base substrate 21.

The first external pad 25c and the second external pad 27c are placed under the base substrate 21. The first and second external pads 25c, 27c may act as connection terminals for supplying electric power to the light emitting diode chips 31, 33. The second external pad 27c has a larger area than the first external pad 25c. The area of the second external pad 27c may be larger than the first external pad 25c in consideration of the ratio of heat generated from the red light emitting diode chip 33 to heat generated from the short wavelength light emitting diode chip 31. For example, when the quantity of heat generated from the red light emitting diode chip 33 is two times greater than that of heat generated from the short wavelength light emitting diode chip 31, the area of the second external pad 27c may be about two times greater than the area of the first external pad 25c.

The first landing pad 25a may be connected to the first external pad 25c through the first via 25b, and the second landing pad 27a may be connected to the second external pad 27c through the second via 27b.

The short wavelength light emitting diode chip 31 is mounted on the first landing pad 25a and is thermally connected to the first landing pad 25a. The short wavelength light emitting diode chip 31 may be an AlInGaN-based light emitting diode chip emitting blue or UV light. The red light emitting diode chip 33 is mounted on the second landing pad 27a and is thermally coupled to the second landing pad 27a. The red light emitting diode chip 33 is an AlInGaP-based light emitting diode chip emitting red light. The short wavelength light emitting diode chip 31 may have any structure, for example, a lateral structure or a vertical structure, without being limited to a certain structure. The red light emitting diode chip 33 may have any structure, for example, a lateral structure or a vertical structure, without being limited to a certain structure. These light emitting diode chips 31, 33 may be electrically connected to the landing pads 25a, 27a through bonding wires (not shown) in various ways according to the structures thereof. In addition, the light emitting diode chips 31, 33 may be connected to each other in series or in parallel, without being particularly limited to a certain connection method.

The molding portion 35 may cover the short wavelength light emitting diode chip 31 and the red light emitting diode chip 33. The molding portion 35 protects the light emitting diode chips 31, 33 and the bonding wires from moisture and the like. In addition, the molding portion 35 may contain the phosphors 36 therein. The phosphors 36 convert wavelengths of light emitted from the short wavelength light emitting diode chip 31. For example, when the short wavelength light emitting diode chip 31 is a blue light emitting diode chip, the phosphors 36 may be yellow phosphors. As a result, white light can be realized by combination of blue light emitted from the blue light emitting diode chip, yellow light emitted from the yellow phosphors and red light emitted from the red light emitting diode chip 31. Alternatively, when the short wavelength light emitting diode chip 31 is a UV light emitting diode chip, the phosphors 36 may include blue phosphors and yellow phosphors.

According to this embodiment, heat generated from the short wavelength light emitting diode chip 31 is mainly discharged through the first landing pad 25a, the first via 25b and the first external pad 25c, and heat generated from the red light emitting diode chip 33 is mainly discharged through the second landing pad 27a, the second via 27b and the second external pad 27c. The first landing pad 25a, the first via 25b and the first external pad 25c constitute a first heat dissipator as a first heat transfer passage, and the second landing pad 27a, the second via 27b and the second external pad 27c constitute a second heat dissipator as a second heat transfer passage. Here, since the second external pad 27c has a greater area than the first external pad 25c, the second heat dissipator has higher heat dissipation capability than the first heat dissipator. As a result, heat generated from the red light emitting diode chip can be more rapidly discharged, thereby preventing deterioration of the red light emitting diode chip over time.

In this embodiment, the first landing pad 25a may be formed of the same material as that of the second landing pad 27a, the first via 25b may be formed of the same material as that of the second via 27b, and the first external pad 25c may be formed of the same material as that of the second external pad 27c, without being limited thereto. Alternatively, they may be formed of different materials having different coefficients of thermal conductivity. For example, the second landing pad 27a may be formed of a material having a higher coefficient of thermal conductivity than that of the first landing pad 25a; the second via 27b may be formed of a material having a higher coefficient of thermal conductivity than that of the first via 25b, and the second external pad 27c may be formed of a material having a higher coefficient of thermal conductivity than that of the first external pad 25c.

In this embodiment, the first heat dissipator may be separated from the second heat dissipator, whereby thermal interference between the light emitting diode chips 31, 33 can be reduced.

Figure 2:
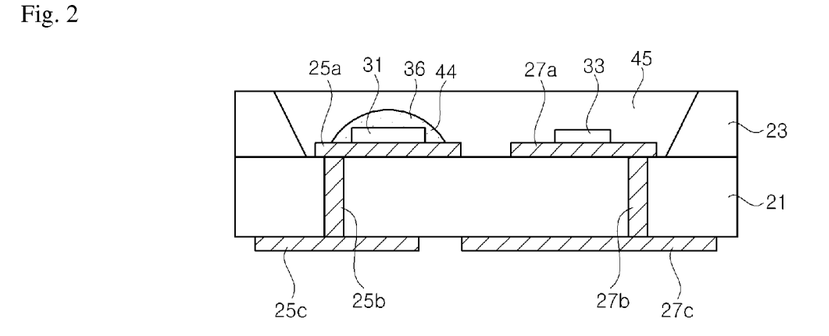
FIG. 2 is a schematic sectional view of a light emitting diode assembly according to another embodiment of the present invention.

FIG. 2 is a schematic sectional view of a light emitting diode assembly according to another embodiment of the present invention.

Referring to FIG. 2, the light emitting diode assembly according to this embodiment is generally similar to the light emitting diode assembly described with reference to FIG. 1, except that phosphors 36 are provided only to a short wavelength light emitting diode chip 31.

Specifically, a molding portion 44 containing the phosphors covers the short wavelength light emitting diode chip 31 and a red light emitting diode chip is placed outside the molding portion 44. In addition, a molding portion 45 does not contain the phosphors and covers the light emitting diode chips 31, 33.

According to this embodiment, the phosphors 36 are placed only around the area of the short wavelength light emitting diode chip 31, whereby light emitted from the red light emitting diode chip 33 can be prevented from being lost by the phosphors 36 and the amount of phosphors used in the light emitting diode assembly can be reduced.

Figure 3:
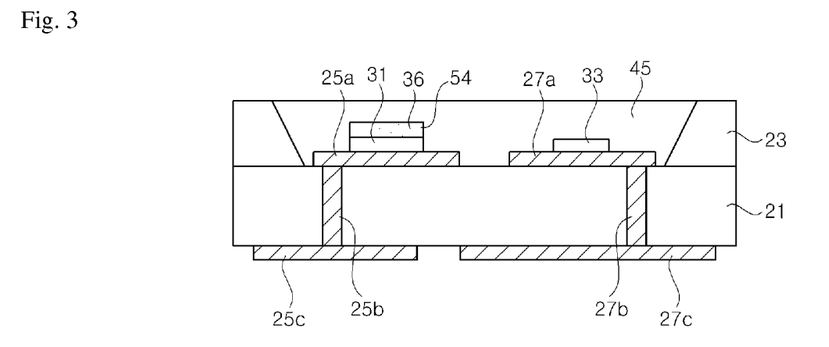
FIG. 3 is a schematic sectional view of a light emitting diode assembly according to a further embodiment of the present invention.

FIG. 3 is a schematic sectional view of a light emitting diode assembly according to a further embodiment of the present invention.

Referring to FIG. 3, the light emitting diode assembly according to this embodiment is generally similar to the light emitting diode assembly described with reference to FIG. 1, except that the phosphors 36 of the light emitting diode assembly shown in FIG. 1 are provided in a conformal coating layer 54.

Specifically, the conformal coating layer 54 containing phosphors covers a short wavelength light emitting diode chip 31, and a red light emitting diode chip is separated from the conformal coating layer 54. In addition, a molding portion 45 does not contain the phosphors and covers the light emitting diode chips 31, 33.

According to this embodiment, the phosphors are placed only around the area of the short wavelength light emitting diode chip 31, whereby light emitted from the red light emitting diode chip 33 can be prevented from being lost by the phosphors 36 and the amount of phosphors used in the light emitting diode assembly can be reduced. In addition, the phosphors are provided by the conformal coating layer 54, thereby achieving uniform wavelength conversion.

Figure 4:
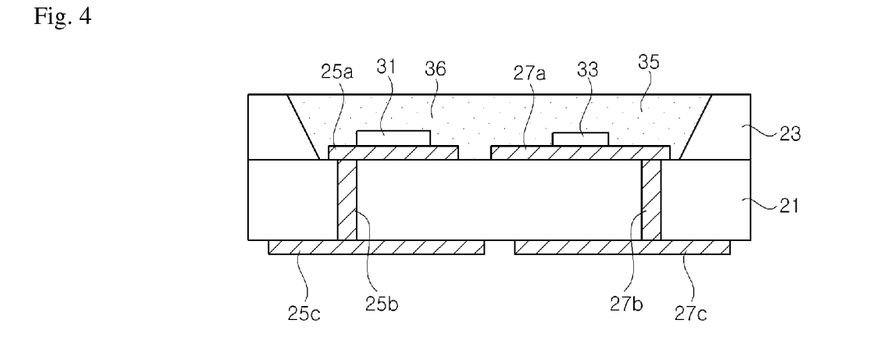
FIG. 4 is a schematic sectional view of a light emitting diode assembly according to yet another embodiment of the present invention.

FIG. 4 is a schematic sectional view of a light emitting diode assembly according to yet another embodiment of the present invention.

Referring to FIG. 4, the light emitting diode assembly according to this embodiment is generally similar to the light emitting diode assembly described with reference to FIG. 1, except that a second landing pad 27a has a larger area than a first landing pad 25a.

Specifically, the second landing pad 27a placed on a base substrate 21 occupies a larger area than the first landing pad 25a. As a result, the second heat dissipator can more rapidly dissipate heat generated from a red light emitting diode chip 33.

In this embodiment, phosphors 36 are included in a molding portion 35. Alternatively, the phosphors 36 may be included in the molding portion 44 as shown in FIG. 2, or may be provided by the conformal coating layer 54 as shown in FIG. 3.

Figure 5:
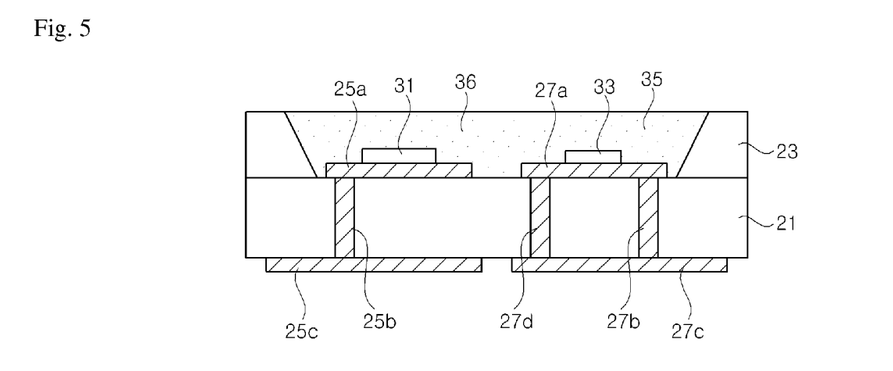
FIG. 5 is a schematic sectional view of a light emitting diode assembly according to yet another embodiment of the present invention.

FIG. 5 is a schematic sectional view of a light emitting diode assembly according to yet another embodiment of the present invention.

Referring to FIG. 5, the light emitting diode assembly according to this embodiment is generally similar to the light emitting diode assembly described with reference to FIG. 1, except that the light emitting diode assembly includes another second via 27d in addition to the second via 27b.

Specifically, according to this embodiment, the number of second vias 27b, 27d is greater than the number of first vias 25b to allow more rapid discharge of heat generated from the red light emitting diode chip 33. Alternatively, instead of increasing the number of second vias, the size of the second via, that is, the volume of the second via, may be increased.

In this embodiment, phosphors 36 are included in a molding portion 35. Alternatively, the phosphors 36 may be included in the molding portion 44 as shown in FIG. 2, or may be provided by the conformal coating layer 54 as shown in FIG. 3.

Figure 6:
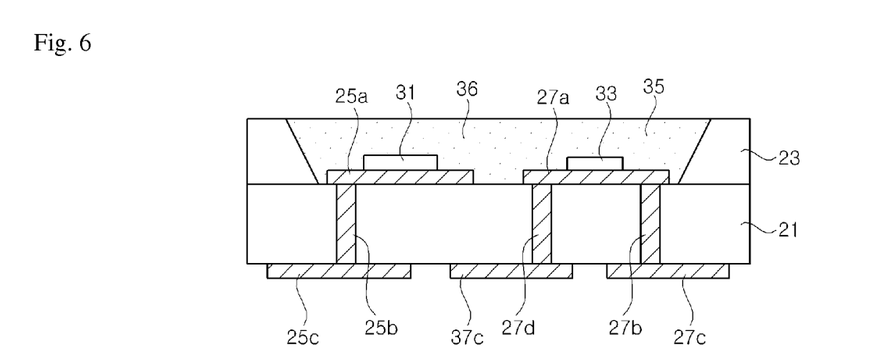
FIG. 6 is a schematic sectional view of a light emitting diode assembly according to yet another embodiment of the present invention.

FIG. 6 is a schematic sectional view of a light emitting diode assembly according to yet another embodiment of the present invention.

Referring to FIG. 6, the light emitting diode assembly according to this embodiment is generally similar to the light emitting diode assembly described with reference to FIG. 5, except that the light emitting diode assembly includes a dummy pad 37c in addition to a second via 27d, which is connected to the dummy pad 37c.

The dummy pad 37c provides an additional heat transfer passage to aid in discharge of heat from a red light emitting diode chip 33.

In addition to the second landing pad 27a, a bonding pad (not shown) is provided such that a second external pad 27c can be connected to the bonding pad through the second via 27b. In this case, a bonding wire may be connected to the bonding pad, thereby facilitating electrical connection between the light emitting diode chips 31, 33. This structure will be described below with reference to FIG. 9.

Figure 7:
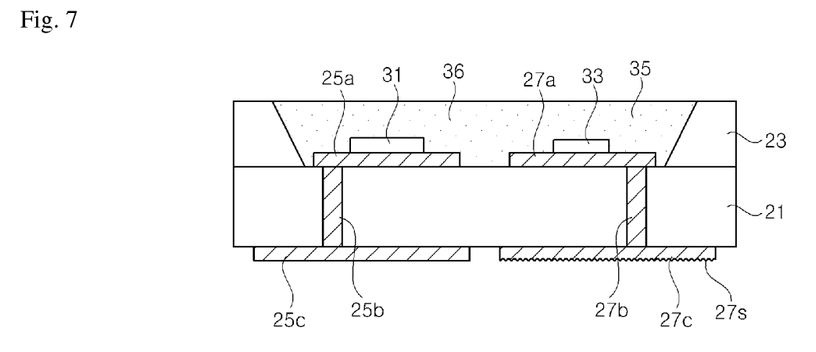
FIG. 7 is a schematic sectional view of a light emitting diode assembly according to yet another embodiment of the present invention.

FIG. 7 is a schematic sectional view of a light emitting diode assembly according to yet another embodiment of the present invention.

Referring to FIG. 7, the light emitting diode assembly according to this embodiment is generally similar to the light emitting diode assembly described with reference to FIG. 1, except that a second external pad 27c is formed with protrusions and depressions on a surface thereof.

That is, since the protrusions and depressions are formed on the surface of the second external pad 27c, it is possible to increase a surface area of the second external pad 27c without increasing the width of the second external pad 27c. With the increased surface area of the second external pad 27c, the light emitting diode assembly may have improved heat dissipation through the second external pad 27c.

In this embodiment, phosphors 36 are included in a molding portion 35. Alternatively, the phosphors 36 may be included in the molding portion 44 as shown in FIG. 2, or may be provided by the conformal coating layer 54 as shown in FIG. 3.

Figure 8:
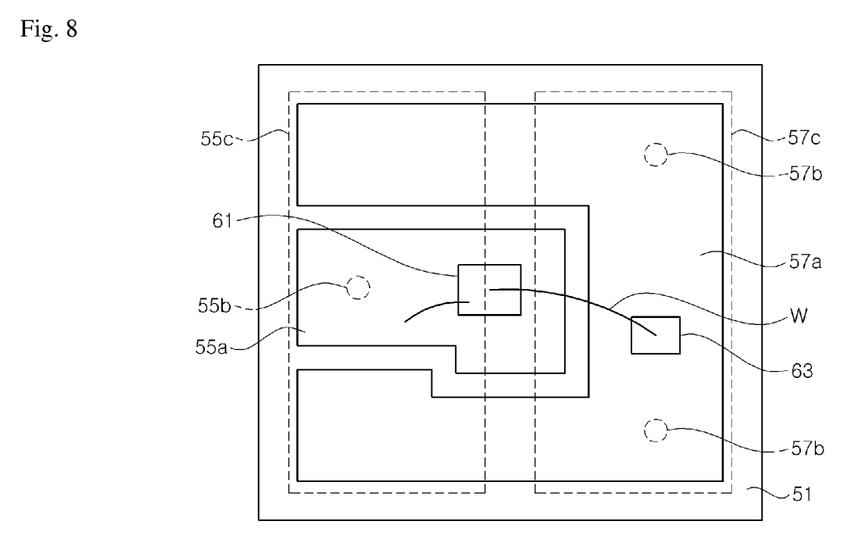
FIG. 8 is a schematic plan view of a light emitting diode assembly according to yet another embodiment of the present invention.

FIG. 8 is a schematic plan view of a light emitting diode assembly according to yet another embodiment of the present invention.

Referring to FIG. 8, the light emitting diode assembly includes a base substrate 51, a first landing pad 55a, a second landing pad 57a, a first via 55b, a second via 57b, a first external pad 55c, a second external pad 57c, a short wavelength light emitting diode chip 61, and a red light emitting diode chip 63. In addition, although not shown in the drawings, the light emitting diode assembly according to this embodiment may further include a wavelength converter, which converts wavelengths of light emitted from the short wavelength light emitting diode chip 61, for example, a molding portion containing phosphors (see FIG. 1 or FIG. 2) or a conformal coating layer (see FIG. 3), and a housing placed on the base substrate 51.

The base substrate 51 is the same as the base substrate 21 described with reference to FIG. 1, and a detailed description thereof will be omitted.

The first landing pad 55a is a pad on which the short wavelength light emitting diode chip 61 is mounted, and the second landing pad 57a is a pad on which the red light emitting diode chip 63 is mounted. Both the first and second landing pad 55a, 57a are placed on the base substrate 21. The first and second landing pads 55a, 57a are formed of a conductive material and thus have higher thermal conductivity than the base substrate 51.

The second landing pad 57a may have a larger area than the first landing pad 55a, and may be disposed to surround three sides of the first landing pad 55a, as shown in the drawing. The first landing pad 55a is disposed over a central region from one edge of the base substrate 51. As the second landing pad 57a is disposed along the edge of the base substrate 51, the second landing pad 57a can more efficiently discharge heat generated from the red light emitting diode chip 63. In addition, as the second landing pad 57a occupies a larger area than the first landing pad 55a, it is possible to form a greater number of second vias 57b than the number of first vias 55b.

The first external pad 55c and the second external pad 57c are placed under the base substrate 51. The first and second external pads 55c, 57c may act as connection terminals for supplying electric power to the light emitting diode chips 31, 33. The second external pad 57c may have a larger area than the first external pad 55c.

The first landing pad 55a is connected to the first external pad 55c through the first via 55b, and the second landing pad 57a is connected to the second external pad 57c through the second via 57b. The first via 55b transfers heat from the first landing pad 55a to the first external pad 55c, and the second vias 57b transfer heat from the second landing pad 57a to the second external pad 57c.

The short wavelength light emitting diode chip 61 and the red light emitting diode chip 63 are the same as the light emitting diode chips 31, 33 shown in FIG. 1, respectively, and thus, detailed descriptions thereof will be omitted. In this embodiment, the short wavelength light emitting diode chip 61 has a lateral structure, in which two electrode pads (not shown) are placed on an upper surface thereof, and the red light emitting diode chip 63 has a vertical structure, in which an n-electrode pad and a p-electrode pad are placed on upper and lower surfaces of the red light emitting diode chip, respectively.

For example, when the n-electrode pad of the red light emitting diode chip 63 is placed on the upper surface of the chip, the second external pad 57c acts as a positive terminal and the first external pad 55c acts as a negative terminal. The n-electrode pad of the red light emitting diode chip 63 is connected to a p-electrode pad of the short wavelength light emitting diode chip 61 via a bonding wire W, and an n-electrode pad of the short wavelength light emitting diode chip 61 is connected to the first landing pad 55a via another bonding wire W. As a result, the short wavelength light emitting diode chip 61 and the red light emitting diode chip 63 are connected to each other in series between the first external pad 55c and the second external pad 57c.

In this embodiment, the second landing pad 57a has a larger area than the first landing pad 55a, whereby the light emitting diode assembly has a greater number of second vias 57b than the number of first vias 57a, thereby enabling more rapid discharge of heat generated from the red light emitting diode chip 63. Furthermore, the second external pad 57c is formed to have a larger area than the first external pad 55c, thereby enabling further improved heat dissipation.

Although the short wavelength light emitting diode chip 61 and the red light emitting diode chip 63 are illustrated as being connected to each other in series in this embodiment, the short wavelength light emitting diode chip 61 may be connected in parallel to the red light emitting diode chip 63.

According to this embodiment, heat generated from the short wavelength light emitting diode chip 61 is mainly discharged through the first landing pads 55a, the first via 55b and the first external pad 55c, and heat generated from the red light emitting diode chip 63 is mainly discharged through the second landing pad 57a, the second via 57b and the second external pad 57c. The first landing pad 55a, the first via 55b and the first external pad 55c constitute a first heat dissipator as a first heat transfer passage, and the second landing pad 57a, the second via 57b and the second external pad 57c constitute a second heat dissipator as a second heat transfer passage. Here, since the second heat dissipator has higher heat dissipation capability than the first heat dissipator, heat generated from the red light emitting diode chip can be more rapidly discharged, thereby preventing deterioration of the red light emitting diode chip over time. Particularly, since the number of second vias 57b is greater than the number of first vias 55b, the number of heat transfer passages is increased, thereby improving heat transfer capabilities.

In this embodiment, the first landing pad 55a may be formed of the same material as that of the second landing pad 57a, the first via 55b may be formed of the same material as that of the second via 57b, and the first external pad 55c may be formed of the same material as that of the second external pad 57c, without being limited thereto. Alternatively, they may be formed of different materials having different coefficients of thermal conductivity.

In this embodiment, the first heat dissipator may be separated from the second heat dissipator, whereby thermal interference between the light emitting diode chips 31, 33 can be reduced.

Figure 9:
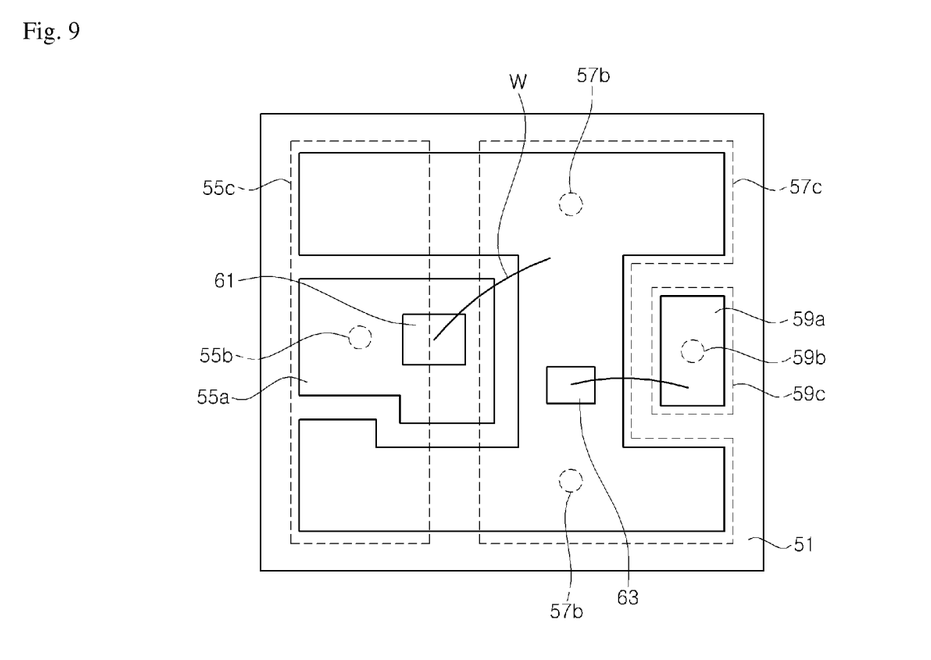
FIG. 9 is a schematic plan view of a light emitting diode assembly according to yet another embodiment of the present invention.

FIG. 9 is a schematic plan view of a light emitting diode assembly according to yet another embodiment of the present invention.

Referring to FIG. 9, the light emitting diode assembly according to this embodiment is generally similar to the light emitting diode assembly shown in FIG. 8, except that the short wavelength light emitting diode chip 61 has a vertical structure. In this embodiment, the short wavelength light emitting diode chip 61 has an n-electrode pad placed on an upper surface thereof.

In addition to the first landing pad 55a and the second landing pad 57a, a bonding pad 59a is placed on the base substrate 51. The light emitting diode assembly according to this embodiment further includes a third external pad 59c placed under the base substrate 51 such that the bonding pad 59a is connected to the third external pad 59c through a third via 59b.

The n-electrode pad placed on the upper surface of the short wavelength light emitting diode chip 61 is connected to the second landing pad 57a via a bonding wire W, and an n-electrode pad placed on an upper surface of the red light emitting diode chip 63 is connected to the bonding pad 59a through another bonding wire W.

In this embodiment, the first external pad 55c acts as a positive terminal, the third external pad 59c acts as a negative terminal, and the short wavelength light emitting diode chip 61 and the red light emitting diode chip 63 are connected in parallel to each other between the first external pad 55c and the third external pad 59c.

In the light emitting diode assembly according to this embodiment, the bonding pad 59a is additionally placed on the base substrate 51, thereby increasing the degree of freedom for selection of the light emitting diode chips 61, 63 having various structures. For example, as described in the embodiment of FIG. 8, a lateral type short wavelength light emitting diode chip and a vertical type red light emitting diode chip can be mounted on the first landing pad 55a and the second landing pad 57a, respectively, whereby the bonding pad 59c may remain un-used.

Figure 10:
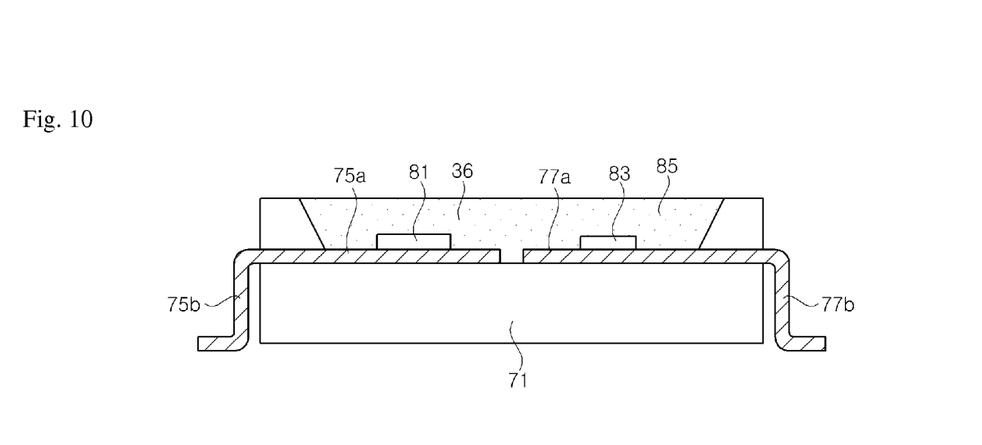
FIG. 10 and FIG. 11 are a schematic sectional view and a schematic plan view of a light emitting diode assembly according to yet another embodiment of the present invention, respectively.
Figure 11:
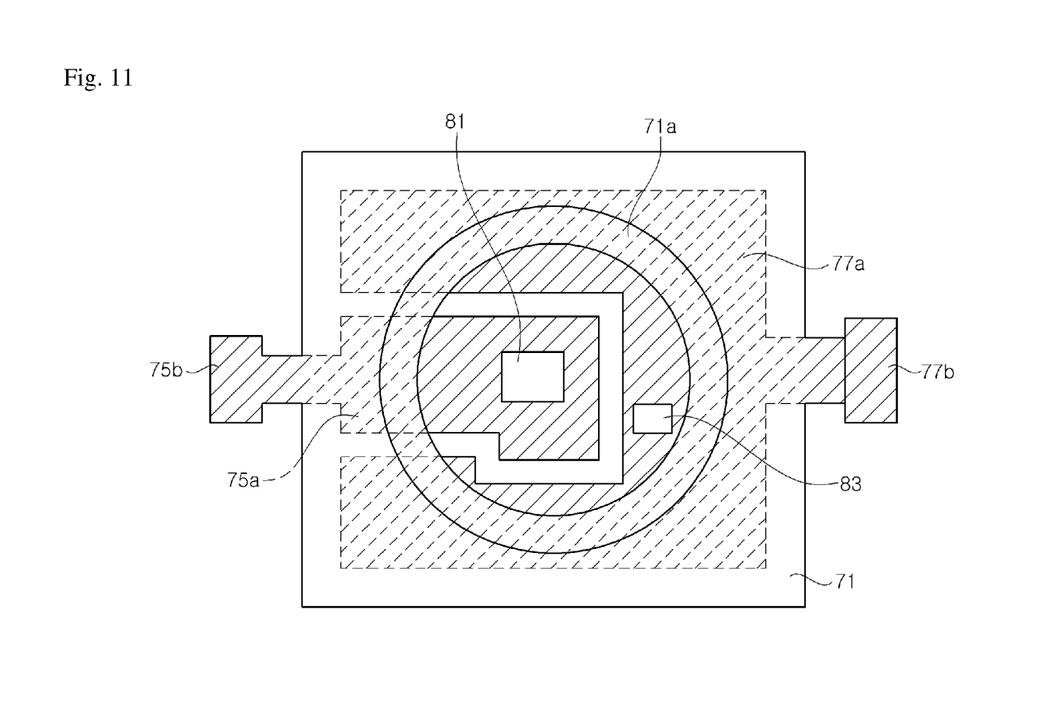

FIG. 10 and FIG. 11 are a schematic sectional view and a schematic plan view of a light emitting diode assembly according to yet another embodiment of the present invention, respectively.

Referring to FIGS. 10 and 11, the light emitting diode assembly according to this embodiment includes a main body 71, a first internal lead 75a, a first external lead 75b, a second internal lead 77a, a second external lead 77b, a short wavelength light emitting diode chip 81, a red light emitting diode chip 83, a molding portion 85, and phosphors 36.

The main body 71 may be formed of plastics, for example, by insert-molding a lead frame. The main body 71 has a cavity through which the internal leads 75a, 77a are exposed. Here, the cavity may have a slanted sidewall to form a reflective face 71a.

The first internal lead 75a and the second internal lead 77a are placed on a bottom of the cavity of the main body 71, the first external lead 75b extends from the first internal lead 75a to be exposed outside the main body 71, and the second external lead 77b extends from the second internal lead 77a to be exposed outside the main body 71. The first and second external leads 75b, 77b may be bent outside the main body.

The second internal lead 77a may occupy a larger area than the first internal lead 75a, and/or the second external lead 77b may occupy a larger area than the first external lead 75b. For example, as shown in FIG. 11, the second internal lead 77a may be disposed to surround three sides of the first internal lead 75a, and the second external lead 77b may be formed to have a larger area than the first external lead 75a.

The short wavelength light emitting diode chip 81 is mounted on the first internal lead 75a to be thermally coupled thereto, and the red light emitting diode chip 83 is mounted on the second internal lead 77a to be thermally coupled thereto. The short wavelength light emitting diode chip 81 and the red light emitting diode chip 83 may be connected to each other in series or in parallel via bonding wires (not shown).

According to this embodiment, the first internal lead 75a and the first external lead 75b constitute a first heat dissipator, and the second internal lead 77a and the second external lead 77b constitute a second heat dissipator. In other words, heat generated from the short wavelength light emitting diode chip 81 is mainly discharged through the first internal lead 75a and the first external lead 75b, and heat generated from the red light emitting diode chip 83 is mainly discharged through the second internal lead 77a and the second external lead 77b. In this embodiment, since the second internal lead 77a and/or the second external lead 77b has a larger area than the first internal lead 75a or the first external lead 75b, heat generated from the red light emitting diode chip 83 can be more efficiently discharged.

The molding portion 85 may cover the short wavelength light emitting diode chip 81 and the red light emitting diode chip 83. In addition, the molding portion 35 may contain the phosphors 36. The molding portion 85 is the same as the molding portion 35 described with reference to FIG. 1, and thus a detailed description thereof will be omitted.

Although the phosphors 36 are illustrated as being included in the molding portion 85 in this embodiment, the phosphors 36 may be included in the molding portion 44 as shown in FIG. 2, or may be provided by the conformal coating layer 54 as shown in FIG. 3.

Figure 12:
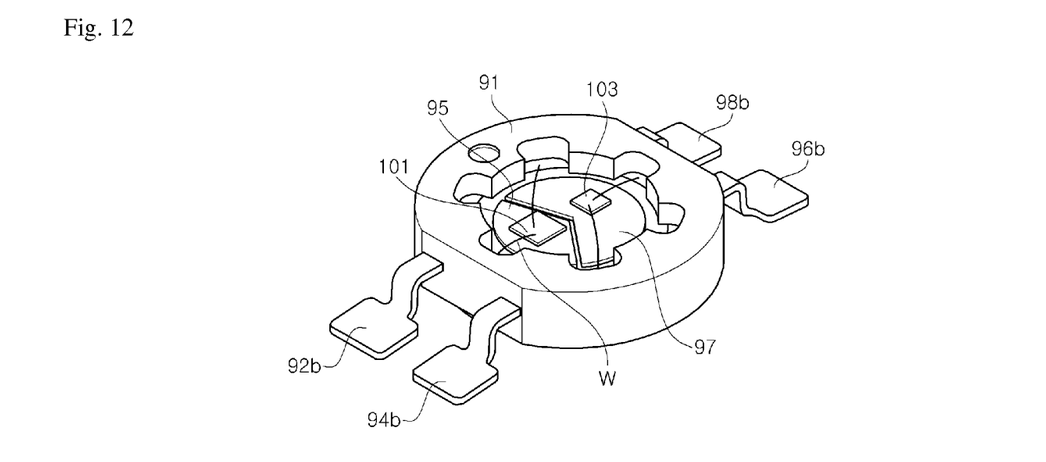
FIG. 12 and FIG. 13 are a schematic perspective view and a schematic plan view of a light emitting diode assembly according to yet another embodiment of the present invention, respectively.
Figure 13:
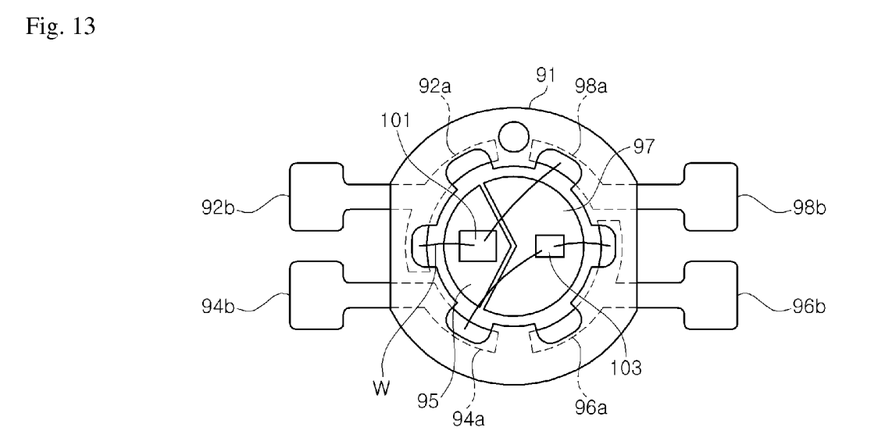
Figure 14:
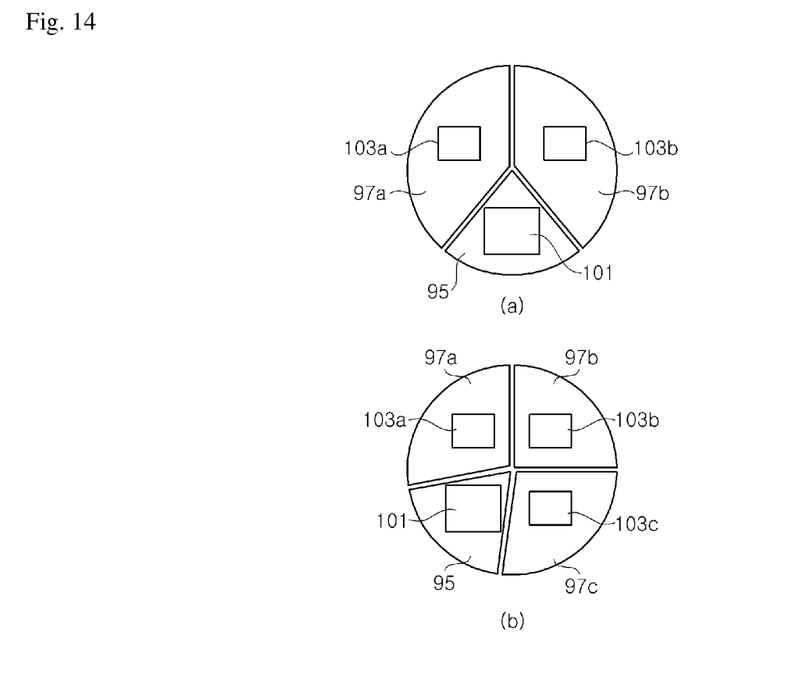
FIG. 14 is a plan view of a heat dissipation slug, illustrating various modification of the light emitting diode assembly of FIGS. 12 and 13.

FIG. 12 and FIG. 13 are a schematic perspective view and a schematic plan view of a light emitting diode assembly according to yet another embodiment of the present invention, respectively, and FIG. 14 is a plan view of a heat dissipation slug, illustrating various modification of the light emitting diode assembly of FIGS. 12 and 13.

Referring to FIGS. 12 and 13, the light emitting diode assembly according to this embodiment includes a main body 91, first internal leads 92a, 94a, first external leads 92b, 94b, second internal leads 96a, 98a, second external leads 96b, 98b, a first heat dissipation slug 95, a second heat dissipation slug 97, a short wavelength light emitting diode chip 101, and a red light emitting diode chip 103. Although not shown, the light emitting diode assembly may further include a molding portion and phosphors.

The main body 91 may be formed of plastics, for example, by insert-molding a lead frame and heat dissipation slugs 95, 97. The main body 91 may have a cavity through which the internal leads 92a, 94a, 96a, 98a and the heat dissipation slugs 95, 97 are exposed.

The first heat dissipation slug 95 and the second heat dissipation slug 97 are placed on a bottom of the cavity of the main body 91, and the first internal leads 92a, 94a and the second internal leads 96a, 98a are placed around the heat dissipation slugs 95, 97. The first internal leads 92a, 94a extend from the first external leads 92b, 94b to be exposed outside the main body 91, respectively, and the second internal leads 96a, 98a extend from the second external leads 96b, 98b to be exposed outside the main body 91, respectively. The first and second external leads 92b, 94b, 96b, 98b may be bent outside the main body.

The second heat dissipation slug 97 has a larger volume than the first heat dissipation slug 95. For example, the first heat dissipation slug 95 and the second heat dissipation slug 97 may be separated from each other and may have a divided cylindrical shape. As shown in FIG. 11 and FIG. 12, an upper surface of the second heat dissipation slug 97 may have a larger area than an upper surface of the first heat dissipation slug 95.

The short wavelength light emitting diode chip 101 is mounted on the first heat dissipation slug 95a to be thermally coupled thereto, and the red light emitting diode chip 103 is mounted on the second heat dissipation slug 97 to be thermally coupled thereto. The short wavelength light emitting diode chip 101 and the red light emitting diode chip 103 may be connected to each other in series or in parallel via bonding wires (not shown). For example, when the short wavelength light emitting diode chip 101 and the red light emitting diode chip 103 have a lateral structure, a p-electrode pad and an n-electrode pad of the short wavelength light emitting diode chip 101 may be connected to the first and second internal leads 92a, 98a, respectively, and a p-electrode pad and an n-electrode pad of the red light emitting diode chip 101 may be connected to the first internal lead 94a and the second internal lead 96a, respectively. As a result, the short wavelength light emitting diode chip 101 and the red light emitting diode chip 103 may be connected to each other in parallel and may also be individually operated. In addition, the short wavelength light emitting diode chip 101 may be connected to the red light emitting diode chip 103 in series by a bonding wire. Various connections may be obtained according to the structures of the short wavelength light emitting diode chip 101 and the red light emitting diode chip 103, and the structures of the internal and external leads.

According to the embodiment, the first heat dissipation slug 95 constitutes a first heat dissipator and the second heat dissipation slug 97 constitutes a second heat dissipator. Specifically, heat generated from the short wavelength light emitting diode chip 101 is mainly discharged through the first heat dissipation slug 95, and heat generated from the red light emitting diode chip 103 is mainly discharged through the second heat dissipation slug 97. Here, since the second heat dissipation slug 97 has a larger volume than the first heat dissipation slug 95, the second heat dissipation slug can more efficiently discharge heat generated from the red light emitting diode chip 103.

The molding portion (not shown) may cover the short wavelength light emitting diode chip 101 and the red light emitting diode chip 103. In addition, the molding portion may contain the phosphors therein. The molding portion is the same as the molding portion 35 described with reference to FIG. 1, and thus a detailed description thereof will be omitted.

In this embodiment, the phosphors are included in the molding portion. Alternatively, the phosphors may be included in the molding portion 44 as shown in FIG. 2, or may be provided by the conformal coating layer 54 as shown in FIG. 3.

In addition, although the number of each of the first internal leads and second internal leads is two in this embodiment, it should be understood that the present invention is not limited thereto, and the number of first or second internal leads may be one or three or more.

Further, although the number of each of the first and second heat dissipation slugs 95, 97 is one in this embodiment, the number of heat dissipation slugs may be changed depending on the number of light emitting diode chips used in the assembly. For example, when a single short wavelength light emitting diode chip 101 and two red light emitting diode chips 103a, 103b are used, the light emitting diode assembly may include a single first heat dissipation slug 95 and two second heat dissipation slugs 97a, 97b, as shown in (a) of FIG. 14. In this case, each of the second heat dissipation slugs 97a, 97b may have a larger volume than the first heat dissipation slug 95. In addition, when one short wavelength light emitting diode chip 101 and three red light emitting diode chips 103a, 103b, 103c are used, the light emitting diode assembly may include a single first heat dissipation slug 95 and three second heat dissipation slugs 97a, 97b, 97c, as shown in (b) of FIG. 14. In this case, each of the second heat dissipation slugs 97a, 97b, 97c may have a larger volume than the first heat dissipation slug 95.

Although the plural red light emitting diode chips are illustrated as being respectively placed on the second heat dissipation slugs separated from each other in this embodiment, the red light emitting diode chips may also be placed on a single second heat dissipation slug. In this case, the single second heat dissipation slug may have a larger size than the first heat dissipation slug by taking into account the number of red light emitting diode chips (n) mounted thereon and thermally coupled thereto. For example, in (a) of FIG. 14, the second heat dissipation slugs 97a, 97b may be provided as a monolithic second heat dissipation slug instead of being divided from each other.

Figure 15:
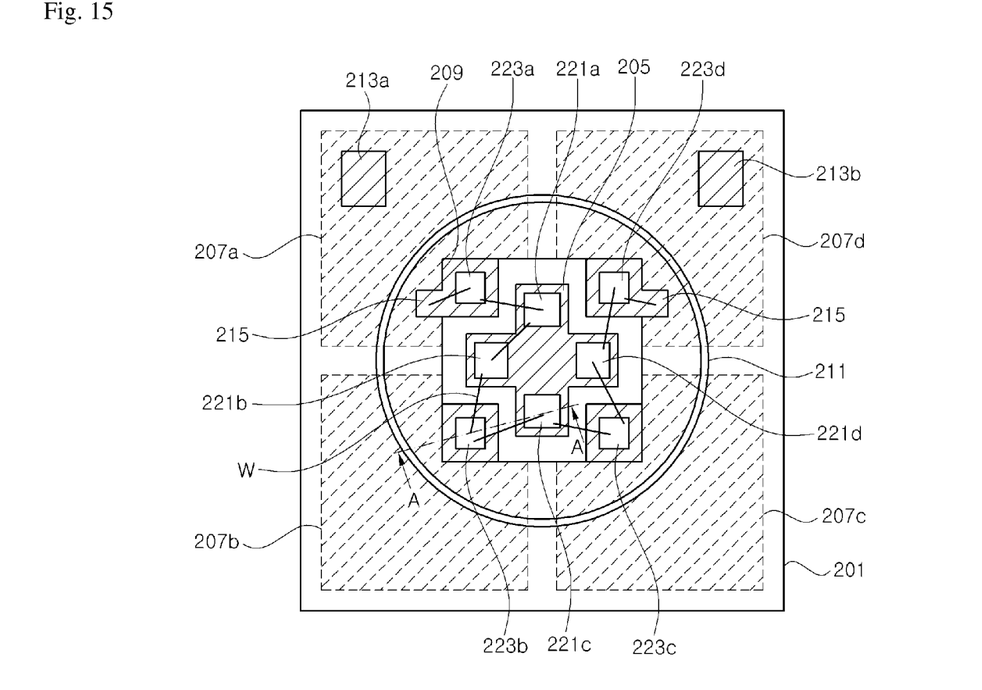
FIG. 15 is a schematic plan view of a light emitting diode assembly according to yet another embodiment of the present invention.
Figure 16:
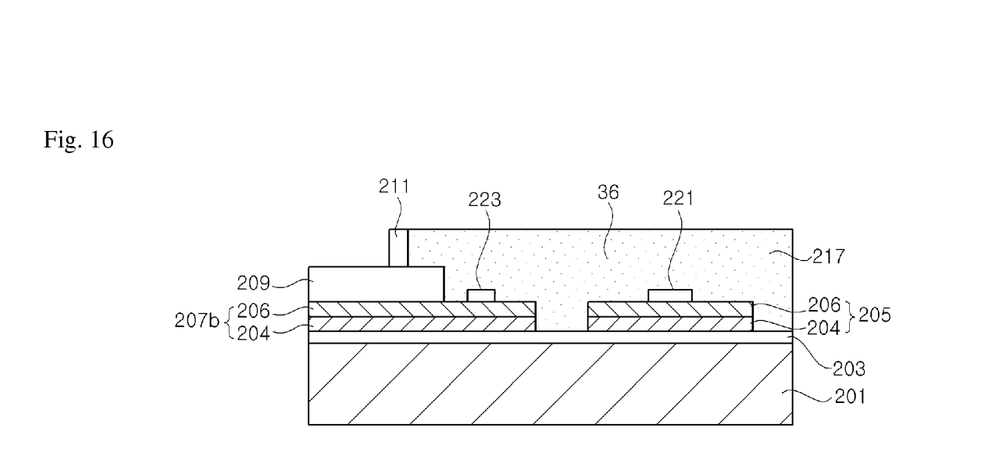
FIG. 16 is a schematic sectional view taken along line A-A of FIG. 15.

FIG. 15 is a schematic plan view of a light emitting diode assembly according to yet another embodiment of the present invention, and FIG. 16 is a schematic sectional view taken along line A-A of FIG. 15. Here, a chip-on-board (COB) type light emitting diode assembly is illustrated.

Referring to FIGS. 15 and 16, a light emitting diode assembly according to this embodiment includes a metal base substrate 201, an insulation layer 203, a first landing pad 205, second landing pads 207: 207a, 207b, 207c, 207d, a solder resist 209, a dam portion 211, short wavelength light emitting diode chips 221: 221a, 221b, 221c, 221d, red light emitting diode chips 223: 223a, 223b, 223c, 223d, and bonding pads 213a, 213b.

The metal base substrate 201 may be, for example, an aluminum substrate. The insulation layer 203 may be formed of, for example, a pre-preg, and insulates a metal layer 204 from the metal substrate 201.

Each of the landing pads 205, 207 may include the metal layer 204 and a reflective layer 206. The metal layer 204 may include copper (Cu) and the reflective layer 206 may include silver (Ag). The landing pads 205, 207 may be formed on the insulation layer by patterning the metal layer 204 or by patterning the metal layer 204 and the reflective layer 206.

The solder resist 209 covers the metal layer 204 and the reflective layer 206 to prevent electrical disconnection due to soldering. The solder resist 209 exposes bonding pads 213a, 213b for connecting sheathed electric wires, and landing pad areas for mounting the light emitting diode chips 221, 223 thereon. In addition, the solder resist 209 may expose landing pad area 215 for connecting bonding wires.

The short wavelength light emitting diode chips 221a, 221b, 221c, 221d are disposed on the first landing pad 205 to be thermally coupled to the first landing pad 205. Although a plurality of short wavelength light emitting diode chips 221 is illustrated as being mounted on a single first landing pad 205 in this embodiment, the first landing pad 205 may be divided into a plurality of areas such that the short wavelength light emitting diode chips can be mounted on the divided areas of the first landing pad 205, respectively. For example, the short wavelength light emitting diode chips 221a, 221b, 221c, 221d may be mounted on the divided areas of the first landing pad 205, respectively.

The red light emitting diode chips 223a, 223b, 223c, 223d are mounted on the second landing pads 207a, 207b, 207c, 207d to be thermally coupled thereto, respectively. Each of the second landing pads 207 has a larger volume than the first landing pad 205. For example, when four short wavelength light emitting diode chips 221 are mounted on the first landing pad 205, each of the second landing pads 207a, 207b, 207c, 207d has a larger volume than each quadrisectional area of first landing pad 205. Further, the second landing pads 207 may be disposed around the first landing pad 205. With this structure, it is possible to improve heat dissipation through the second landing pads as compared with the first landing pad 205.

The short wavelength light emitting diode chip 221 may be an AlInGaN-based light emitting diode chip, for example, a blue or UV light emitting diode chip, and the red light emitting diode chip 223 may be an AlInGaP-based light emitting diode chip.

In FIG. 15, the short wavelength light emitting diode chips 221 and the red light emitting diode chips 223 are illustrated as being connected to each other in series through bonding wires (W). In this embodiment, all of these light emitting diode chips 221, 223 have a lateral structure. However, it should be understood that the light emitting diode chips 221, 223 according to the present invention are not limited to a particular structure. That is, according to the present invention, all of the light emitting diode chips may have a vertical structure, or the light emitting diode chips may be combination of a lateral structure and a vertical structure. In order to connect the light emitting diode chips having various structures to each other, an additional bonding pad (not shown) may be provided together with the landing pads 205, 207.

The dam portion 211 surrounds the light emitting diode chips 221, 223. The dam portion 211 is formed to define the molding portion 217 in a mounting area of the light emitting diode chips and may, for example, be formed in a circular ring shape using a silicone resin. A dam alignment mark (not shown) may be formed on the solder resist 209 in order to adjust a location of the dam portion 211.

The molding portion 217 covers the light emitting diode chips 221, 223 inside the dam portion 211. The molding portion 217 may be formed of a silicone resin and may contain phosphors. White light can be obtained through combination of the light emitting diode chips 221, 223 and the phosphors.

The phosphors may be placed only on the short wavelength light emitting diode chip 221 as shown in FIG. 2, or may be provided as a conformal coating layer as shown in FIG. 3.

Figure 17:
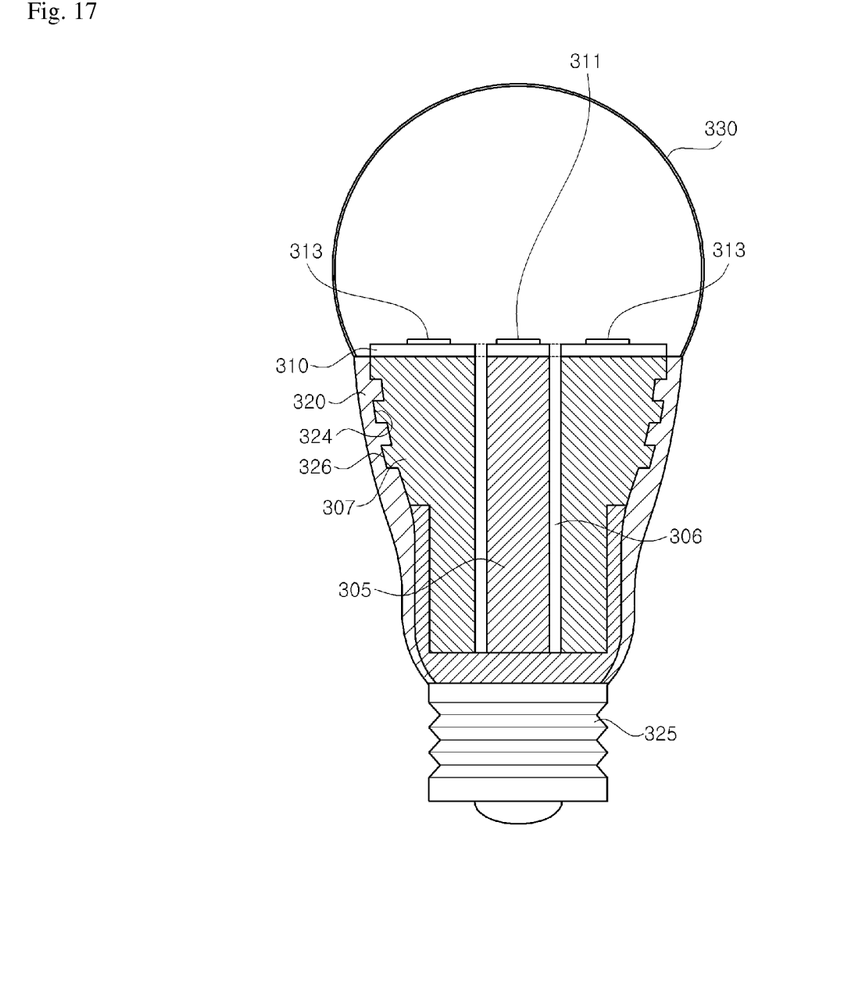
FIG. 17 is a schematic plan view of a light emitting diode assembly according to yet another embodiment of the present invention.
Figure 18:
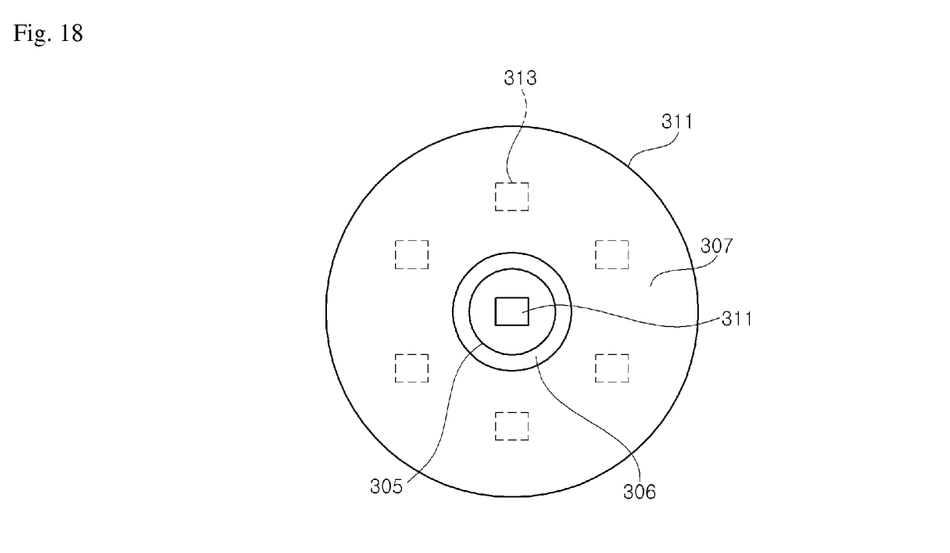
FIG. 18 is a schematic plan view of a heat dissipation slug of FIG. 17.

FIG. 17 is a schematic plan view of a light emitting diode assembly according to yet another embodiment of the present invention, and FIG. 18 is a schematic plan view of a heat dissipation slug of FIG. 17. In this embodiment, a bulb type light emitting diode assembly will be described.

Referring to FIGS. 17 and 18, the light emitting diode assembly includes a first heat dissipation slug 305, a second heat dissipation slug 307, a casing 320, a socket base 325, and a cap 330. The casing 320 is an upper side open type casing, which is open at an upper side thereof, and the first and second heat dissipation slugs 305, 307 may be received in the casing through the upper side open type casing.

The first heat dissipation slug 305 may have an elongated cylindrical shape, and a short wavelength light emitting diode chip 311 is disposed on the first heat dissipation slug 305. The second heat dissipation slug 307 surrounds the first heat dissipation slug 305 and is provided with a through-hole, through which the first heat dissipation slug 305 can be inserted into the second heat dissipation slug 307. Red light emitting diode chips 313 may be disposed on the second heat dissipation slug 307. The red light emitting diode chips 313 may be arranged at constant intervals to surround the short wavelength light emitting diode chip 311.

In addition, the short wavelength light emitting diode chip 311 and the red light emitting diode chips 313 may be mounted on a printed circuit board 310 to be disposed on the heat dissipation slugs 305, 307, or may be disposed in package form.

The first heat dissipation slug 305 mainly discharges heat generated from the short wavelength light emitting diode chip 311, and the second heat dissipation slug 307 mainly discharge heat generated from the red light emitting diode chips 313. The second heat dissipation slug 307 is configured to have higher dissipation capabilities than the first heat dissipation slug 305. For example, an upper surface of the second heat dissipation slug 307 has a larger area than that of the first heat dissipation slug 305, and a total surface area of the second heat dissipation slug 307 is also larger than that of the first heat dissipation slug 305. For example, as shown in FIG. 18, when a single short wavelength light emitting diode chip 311 is placed on the first heat dissipation slug 305 and six red light emitting diode chips 313 are placed on the second heat dissipation slug 307, the upper surface of the second heat dissipation slug 307 has an area six times larger than that of the first heat dissipation slug 305. Further, the second heat dissipation slug 307 may have a pattern of protrusions and depressions 324, 326, which may be used as screws.

Although not shown, the molding portion may cover the light emitting diode chips 311, 313, and phosphors 36 may be contained in the molding portion. Alternatively, a conformal coating layer may be formed on the short wavelength light emitting diode chip 311. Further, a phosphor coating layer may be formed on a surface of the cap 330.

According to this embodiment, the second heat dissipation slug 307 has a larger size than the first heat dissipation slug 305, whereby heat generated from the red light emitting diode chips 313 can be rapidly discharged through the second heat dissipation slug 307. In addition, the second heat dissipation slug 307 surrounds the first heat dissipation slug 305, thereby further improving heat dissipation through the second heat dissipation slug 307.

The invention claimed is:

1. A light emitting diode assembly, comprising:
a red light emitting diode chip;
a short wavelength light emitting diode chip emitting light having a shorter wavelength than light emitted from the red light emitting diode chip;
a base substrate;
a first heat dissipator dissipating heat generated from the short wavelength light emitting diode chip and the first heat dissipator comprising:
a first landing pad placed on the base substrate and thermally coupled to the short wavelength light emitting diode chip;
a first external pad placed under the base substrate and a first via connecting the first landing pad to the first external pad; and
a second heat dissipator dissipating heat generated from the red light emitting diode chip and the second heat dissipator comprising:
a second landing pad placed on the base substrate and thermally coupled to the red light emitting diode chip; and
a second external pad placed under the base substrate and a second via connecting the second landing pad to the second external pad,
wherein the second heat dissipator having higher heat dissipation capability than the first heat dissipator and the second via has a larger volume than the first via.

2. The light emitting diode assembly of claim 1, wherein the second landing pad has a larger area than the first landing pad.

3. The light emitting diode assembly of claim 1, wherein the second external pad has a larger area than the first external pad.

4. The light emitting diode assembly of claim 1, further comprising: a main body,
wherein the first heat dissipator comprises a first internal lead placed within the main body and a first external lead extending from the first internal lead and exposed outside the main body, and the second heat dissipator comprises a second internal lead placed within the main body and a second external lead extending from the second internal lead and exposed outside the main body.

5. The light emitting diode assembly of claim 1, wherein the first heat dissipator comprises a first heat dissipation slug and the second heat dissipator comprises a second heat dissipation slug.

6. The light emitting diode assembly of claim 1, wherein the second heat dissipation slug has a large volume than the first heat dissipation slug.

7. The light emitting diode assembly of claim 1, wherein the first heat dissipator is separated from the second heat dissipator.

8. The light emitting diode assembly of claim 1, further comprising:
a wavelength converter converting wavelengths of light emitted from the short wavelength light emitting diode chip,
wherein the light emitting diode assembly emits white light.

9. The light emitting diode assembly of claim 1, wherein the short wavelength light emitting diode chip is a light emitting diode chip emitting blue or ultraviolet light.

10. The light emitting diode assembly of claim 4, wherein the short wavelength light emitting diode chip is thermally coupled to the first internal lead, the red light emitting diode chip is thermally coupled to the second internal lead, and the second heat dissipator occupies a large area than the first heat dissipator.

11. The light emitting diode assembly of claim 5, further comprising:
a main body;
a first internal lead placed within the main body;
a first external lead extending from the first internal lead and exposed outside the main body;
a second internal lead placed within the main body; and
a second external lead extending from the second internal lead and exposed outside the main body.

12. The light emitting diode assembly of claim 5, wherein the second heat dissipation slug surrounds the first heat dissipation slug.

13. A light emitting diode assembly, comprising:
a red light emitting diode chip;
a short wavelength light emitting diode chip emitting light having a shorter wavelength than light emitted from the red light emitting diode chip;
a base substrate;
a first heat dissipator dissipating heat generated from the short wavelength light emitting diode chip and the first heat dissipator comprising:
  a first landing pad placed on the base substrate and thermally coupled to the short wavelength light emitting diode chip; and
  a first external pad placed under the base substrate and a first via connecting the first landing pad to the first external pad; and
a second heat dissipator dissipating heat generated from the red light emitting diode chip and the second heat dissipator comprising:
  a second landing pad placed on the base substrate and thermally coupled to the red light emitting diode chip; and
  a second external pad placed under the base substrate and a second via connecting the second landing pad to the second external pad,
wherein the second heat dissipator has higher heat dissipation capability than the first heat dissipator and the number of second vias is greater than the number of first vias.

14. The light emitting diode assembly of claim 13, wherein the second external pad has a larger surface area than the first external pad.

15. A light emitting diode assembly comprising:
a red light emitting diode chip;
a short wavelength light emitting diode chip emitting light having a shorter wavelength than light emitted from the red light emitting diode chip;
a first heat transfer passage thermally coupled to the short wavelength light emitting diode chip; and
a second heat transfer passage thermally coupled to the red light emitting diode chip,
wherein:
the second heat transfer passage having higher heat transfer capability than the first heat transfer passage; and
the number of second heat transfer passages is greater than the number of first heat transfer passages.

16. The light emitting diode assembly of claim 15, wherein the second heat transfer passage has a larger total volume than the first heat transfer passage.

* * * * *